US008823462B2

(12) United States Patent
Ogino et al.

(10) Patent No.: US 8,823,462 B2
(45) Date of Patent: Sep. 2, 2014

(54) PIEZOELECTRIC OSCILLATION CIRCUIT AND TEMPERATURE-CONSTANT PIEZOELECTRIC OSCILLATOR

(75) Inventors: Akitoshi Ogino, Minowa-machi (JP); Tadayoshi Soga, Sakata (JP); Jun Matsuoka, Sakata (JP); Yuichi Oinuma, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/226,786

(22) Filed: Sep. 7, 2011

(65) Prior Publication Data

US 2012/0105164 A1 May 3, 2012

(30) Foreign Application Priority Data

Oct. 28, 2010 (JP) ................................. 2010-241836

(51) Int. Cl.
*H03B 5/36* (2006.01)
*H03L 1/02* (2006.01)

(52) U.S. Cl.
CPC ................ *H03B 5/362* (2013.01); *H03L 1/028* (2013.01); *H03B 2200/0008* (2013.01); *H03B 5/368* (2013.01)
USPC .................... 331/116 R; 331/158; 331/177 V

(58) Field of Classification Search
CPC ................... H03B 5/362; H03B 5/368; H03B 2200/0008; H03B 2200/004; H03B 2201/0208
USPC ......... 331/116 R, 116 FE, 158, 177 R, 177 V
See application file for complete search history.

(56) References Cited

U.S. PATENT DOCUMENTS

| | | | | |
|---|---|---|---|---|
| 6,172,576 B1 * | 1/2001 | Endo et al. | ................ | 331/116 R |
| 7,382,204 B2 | 6/2008 | Arai et al. | | |
| 7,719,372 B2 * | 5/2010 | Satoh | ............................ | 331/158 |
| 2002/0050867 A1 * | 5/2002 | Kato et al. | ................ | 331/116 R |
| 2009/0115543 A1 | 5/2009 | Satoh | | |

FOREIGN PATENT DOCUMENTS

| | | |
|---|---|---|
| JP | A-10-056330 | 2/1998 |
| JP | A-2005-167510 | 6/2005 |
| JP | A-2005-217773 | 8/2005 |
| JP | A-2006-114974 | 4/2006 |
| JP | A-2006-311496 | 11/2006 |
| JP | A-2010-28502 | 2/2010 |

OTHER PUBLICATIONS

Adrio Communications Ltd, “Transistor crystal oscillator circuit”, http://www.radio-electronics.com/info/circuits/transistor_crystal_oscillator/crystal_oscillator.php, retrieved via archive.org on Jun. 25, 2006.*

* cited by examiner

*Primary Examiner* — Ryan Johnson
(74) *Attorney, Agent, or Firm* — Oliff PLC

(57) ABSTRACT

A piezoelectric oscillation circuit includes: a Colpitts oscillation circuit; a first circuit unit which includes a circuit having a variable-capacity capacitor for controlling an oscillation frequency; a second circuit unit which includes a circuit having a resistance; and a piezoelectric resonator which includes a first terminal connected to the first circuit unit and the second circuit unit, and a second terminal connected to the Colpitts oscillation circuit. The Colpitts oscillation circuit connects the second terminal to a fixed potential via a dividing resistance. The second circuit unit connects the first terminal to the fixed potential via the resistance.

8 Claims, 8 Drawing Sheets

PIEZOELECTRIC OSCILLATION CIRCUIT AND TEMPERATURE-CONSTANT PIEZOELECTRIC OSCILLATOR

BACKGROUND

1. Technical Field

The present invention relates to a piezoelectric oscillation circuit, a temperature-constant piezoelectric oscillator, and others.

2. Related Art

A temperature-constant piezoelectric oscillator increases frequency stability by using a constant-temperature oven for maintaining a constant operation temperature of an oscillator. For example, an oven controlled crystal oscillator (OCXO) which includes a crystal oscillator as a piezoelectric device produces frequency deviation of only about 0.05 ppm at the most, and thus has been employed in the field of radio-communication base station, wire network device, and others.

JP-A-2006-311496 discloses a temperature-constant piezoelectric oscillator which includes components such as a power transistor, a temperature-sensitive resistance (thermistor) and a chip resistance for heating. According to this structure, the operation temperature of the oscillator is kept constant by using the power transistor which supplies power controlled by the resistance of the thermistor to the chip resistance.

In this case, the temperature-constant piezoelectric oscillator thus constructed requires flow of a large current so as to maintain a predetermined operation temperature for the oscillator when used under a low-temperature environment. In an ideal condition, the ground resistance is small enough to be ignored, and the ground potential (GND) does not vary according to the use environment. In a practical situation, however, the ground resistance exhibits a small but definite value, and may produce deviation of some millivolts from the ground potential, for example, when a large current flows. When this change of the ground potential affects only one of the terminals of the oscillator, the direct current potential difference between the terminals of the oscillator varies and changes the oscillation frequency.

SUMMARY

An advantage of some aspects of the invention is to provide a piezoelectric oscillation circuit, a temperature-constant piezoelectric oscillator, and others capable of stabilizing an oscillation frequency by decreasing variations in a potential between terminals of an oscillator even when a fixed potential changes by improvement of a circuit structure.

(1) A piezoelectric oscillation circuit according to an aspect of the invention includes: a Colpitts oscillation circuit; a first circuit unit which includes a circuit having a variable-capacity capacitor for controlling an oscillation frequency; a second circuit unit which includes a circuit having a resistance; and a piezoelectric resonator which includes a first terminal connected to the first circuit unit and the second circuit unit, and a second terminal connected to the Colpitts oscillation circuit. The Colpitts oscillation circuit connects the second terminal to a fixed potential via a dividing resistance. The second circuit unit connects the first terminal to the fixed potential via the resistance.

(2) The fixed potential of the piezoelectric oscillation circuit may be a ground potential.

According to these structures, each of the first terminal and the second terminal of the piezoelectric resonator is connected to the fixed potential via the resistance. Thus, the potential between the terminals does not change even when the fixed potential varies, which stabilizes the oscillation frequency. The fixed potential is a ground potential, for example. The first circuit unit connected with the first terminal includes the capacitor for controlling the oscillation frequency. The capacitor included in the first circuit unit may be a fixed-capacity capacitor, but is determined as a variable-capacity capacitor in this aspect of the invention.

The first circuit unit is provided to control the oscillation frequency by using the capacitor provided therein. On the other hand, the second circuit unit connected with the first terminal is provided to stabilize the oscillation frequency. The second terminal is connected with the fixed potential via the dividing resistance of a resistance dividing circuit in the Colpitts oscillation circuit connected with the second terminal. The second circuit unit can reduce variations in the potential between the terminals and stabilize the oscillation frequency by connecting the first terminal with the same fixed potential.

(3) The first circuit unit of the piezoelectric oscillation circuit may include a variable capacitance diode used as a variable-capacity element, and input a control voltage for determining the capacitance of the variable capacitance diode.

(4) The first circuit unit of the piezoelectric oscillation circuit may include a fixed-capacity capacitor, connect the anode terminal of the variable capacitance diode to the first terminal via the variable-capacity capacitor and to the fixed potential via a resistance different from the resistance of the second circuit unit, and connect the cathode terminal of the variable capacitance diode to which the control applied to the fixed potential via the voltage fixed-capacity capacitor.

According to these structures, the first circuit unit which includes the variable capacitance diode capable of varying its capacity according to the change of the inputted control voltage can control the oscillation frequency with higher flexibility. The variable capacitance diode included in the first circuit unit may be either a single unit or plural units. The first circuit unit may include a fixed-capacity capacitor in addition to the variable capacitance diode to use the variable capacitance diode for fine control of the oscillation frequency. In this case, the frequency variable range controllable by the variable capacitance diode is limited, but a desired oscillation frequency can be easily obtained, when a combination of the fixed-capacity capacitor and the variable capacitance diode are used.

(5) The first circuit unit of the piezoelectric oscillation circuit may include a first variable capacitance diode and a second variable capacitance diode whose cathode terminals are connected to each other, connect the anode terminal of the first variable capacitance diode to the first terminal via the variable-capacity capacitor and to the fixed potential via a resistance different from the resistance of the second circuit unit, connect the anode terminal of the second variable capacitance diode to the fixed potential, and applies the control voltage to the cathode terminals of the first variable capacitance diode and the second variable capacitance diode.

(6) The piezoelectric oscillation circuit may have the following structure. The second circuit unit includes a first resistance and a second resistance connected in series. The first resistance has a terminal connected to the second resistance, and a terminal connected to the first terminal. The second resistance has a terminal connected to the first resistance, and a terminal connected to the fixed potential. The first circuit unit includes a first variable capacitance diode and a second variable capacitance diode whose cathode terminals are connected to each other, connects the anode terminal of the first variable capacitance diode to the first terminal via the variable-capacity capacitor and to the fixed potential via the second resistance, connects the anode terminal of the second variable capacitance diode to the fixed potential, and applies the control voltage to the cathode terminals of the first variable capacitance diode and the second variable capacitance diode.

According to these structures, the frequency variable range for varying the oscillation frequency by the control voltage can be expanded by using a combination of the two variable capacitance diodes. Thus, a desired oscillation frequency can be easily obtained.

(7) The first circuit unit of the piezoelectric oscillation circuit may connect the anode terminal of the variable capacitance diode to the first terminal, and connect the cathode terminal of the variable capacitance diode to which the control voltage is applied to the fixed potential via the variable-capacity capacitor.

(8) The first circuit unit of the piezoelectric oscillation circuit may connect the anode terminal of the variable capacitance diode to the fixed potential, and connect the cathode terminal of the variable capacitance diode to which the control voltage is applied to the first terminal via the variable-capacity capacitor.

According to these structures, the number of the elements included in the first circuit unit can be reduced. Thus, the entire circuit scale can be decreased.

(9) A temperature-constant piezoelectric oscillator according to another aspect of the invention includes the piezoelectric oscillation circuit described above.

This aspect of the invention can provide the temperature-constant piezoelectric oscillator or others capable of reducing variations in the potential between the terminals of an oscillator for stabilization of the oscillation frequency even when a fixed potential changes due to the change of the use environment, for example.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. First Embodiment

Figure 7:
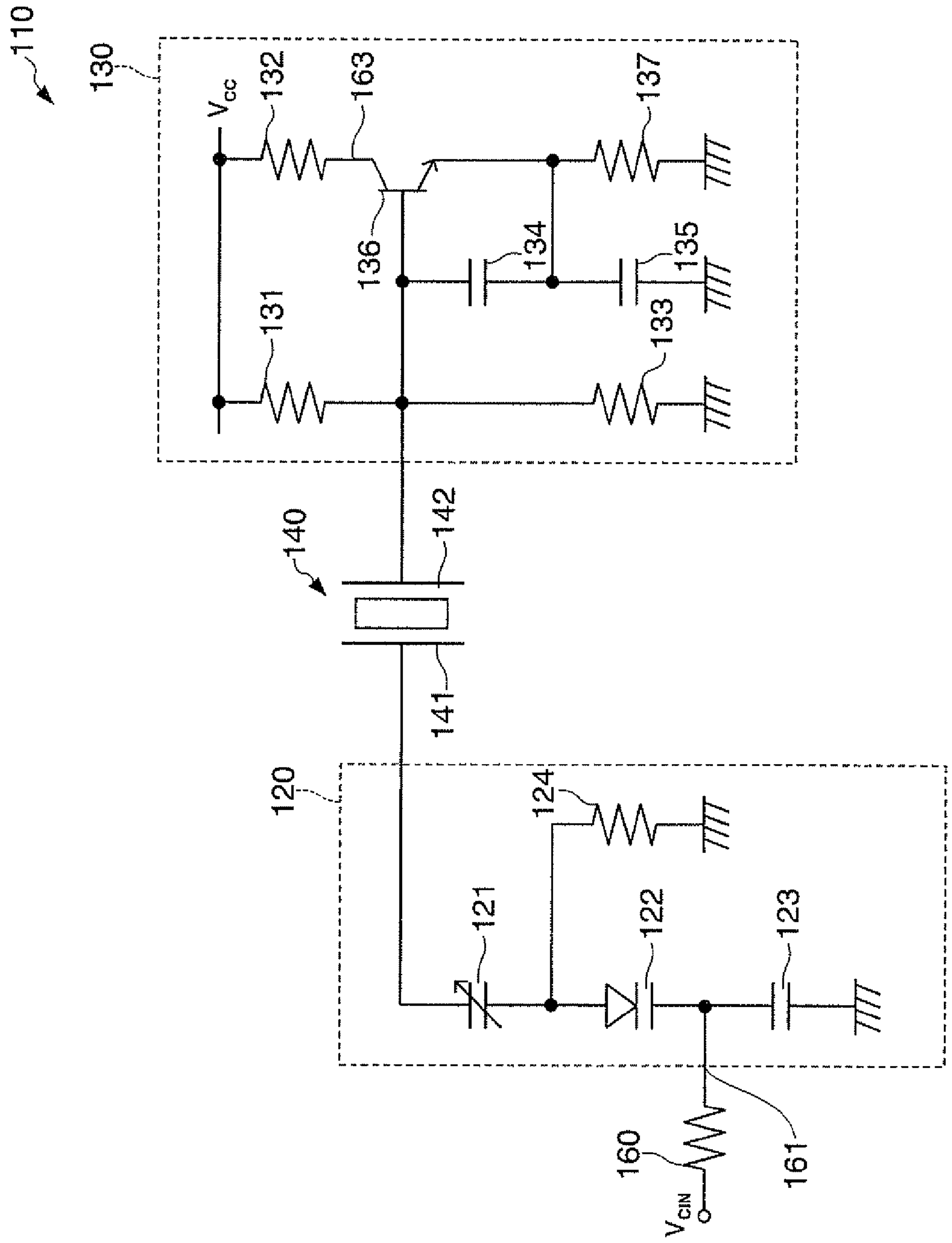
FIG. 7 is a circuit diagram of a piezoelectric oscillation circuit according to a comparison example.
Figure 8A:
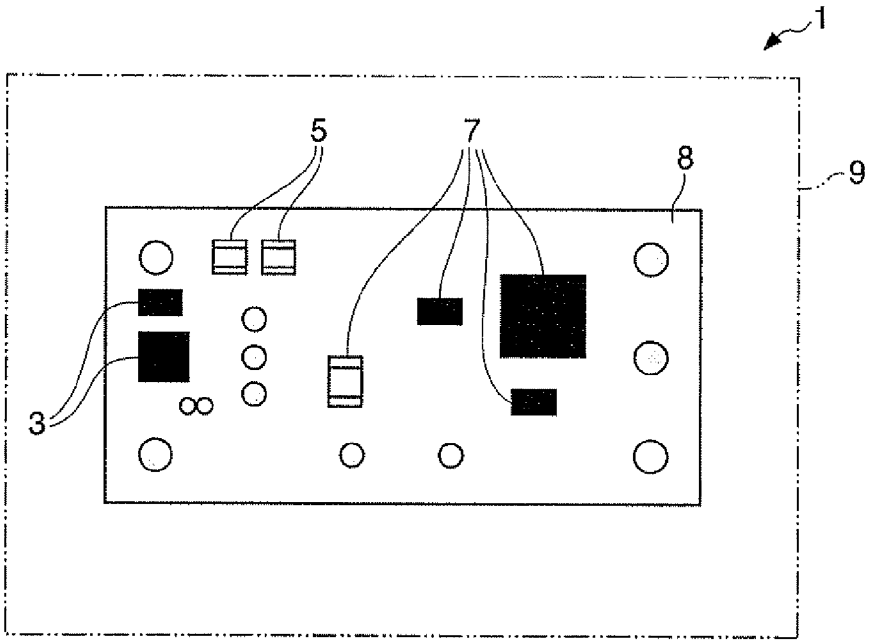
FIGS. 8A and 8B illustrate a temperature-constant piezoelectric oscillator.
Figure 8B:
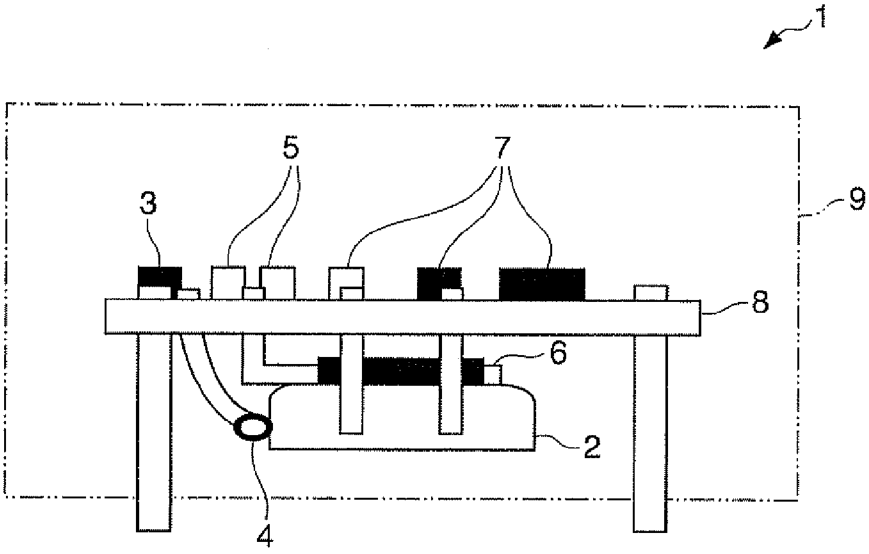

A first embodiment according to the invention is hereinafter described with reference to FIGS. 1 and 2. FIGS. 7, 8A and 8B are referred to as well for explaining a comparison example.

Figure 1:
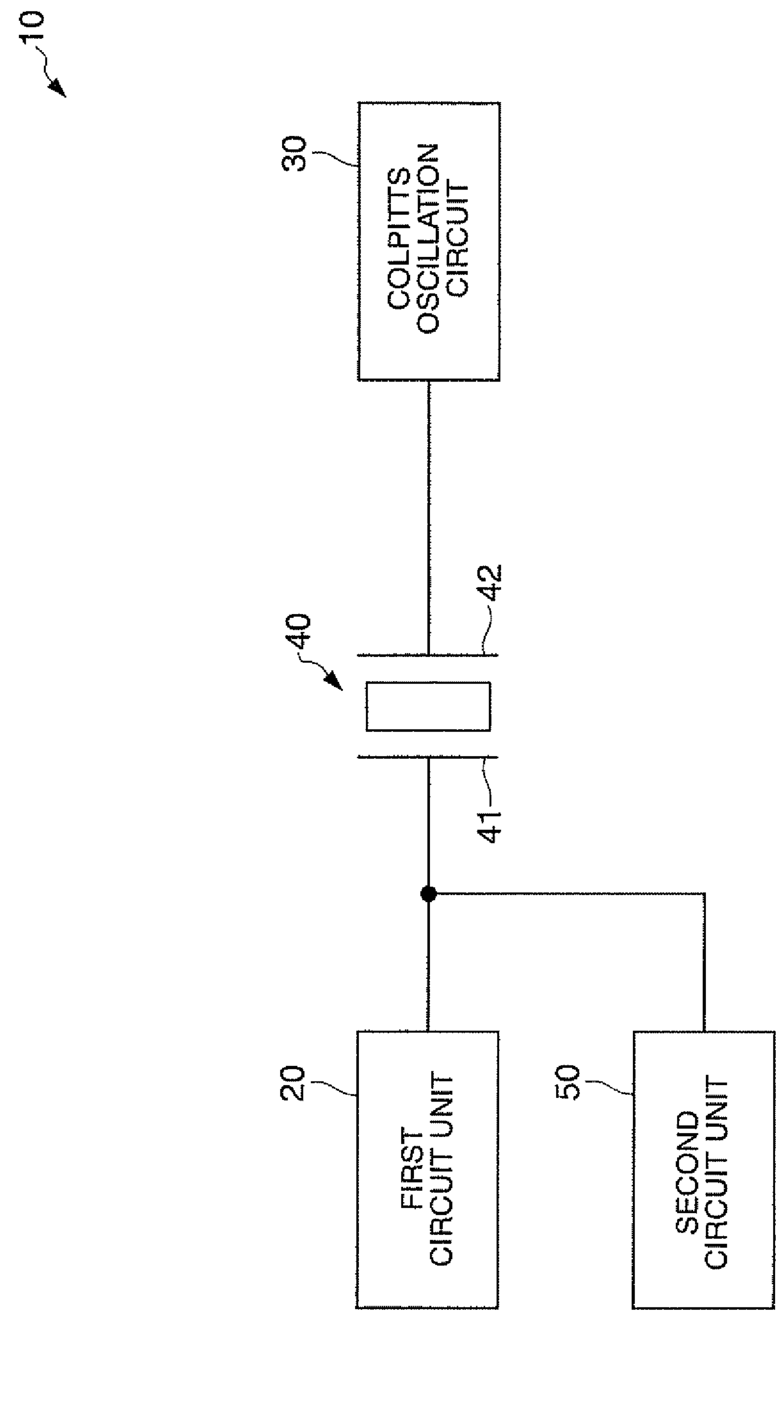
FIG. 1 is a block diagram showing a piezoelectric oscillation circuit according to a first embodiment.

1.1 General Structure of Piezoelectric Oscillation Circuit of First Embodiment FIG. 1 is a block diagram showing a piezoelectric oscillation circuit 10 according to this embodiment. The piezoelectric oscillation circuit 10 includes a first circuit unit 20, a Colpitts oscillation circuit 30, a piezoelectric resonator 40, and a second circuit unit 50.

The first circuit unit 20 has at least one capacitor, and controls an oscillation frequency by adjustment of the load capacity of the capacitor. The first circuit unit 20 is connected with a first terminal 41 as one of the terminals of the piezoelectric resonator 40. The Colpitts oscillation circuit 30 is connected with a second terminal 42 as the other terminal of the piezoelectric resonator 40.

The piezoelectric oscillation circuit 10 in this embodiment includes the second circuit unit 50 connected with the first terminal 41 as well to stabilize the oscillation frequency. The second terminal 42 is connected with a fixed potential via a resistance in the Colpitts oscillation circuit 30. This fixed potential is a ground potential in this embodiment, but may be other potentials. According to this embodiment, the first terminal 41 is also connected with the ground potential via a resistance in the second circuit unit 50. In this structure, a change of the ground potential has an equal effect on the first terminal 41 and the second terminal 42, and does not vary the direct current potential difference between the terminals of the piezoelectric resonator 40. By this method, the piezoelectric oscillation circuit 10 in this embodiment can stabilize the oscillation frequency.

1.2 Comparison with Piezoelectric Oscillation Circuit of Comparison Example Problems arising from a piezoelectric oscillation circuit and a temperature-constant piezoelectric oscillator including this circuit according to a comparison example are herein clarified with reference to FIGS. 7 and 8A and 8B before describing a circuit diagram of the piezoelectric oscillation circuit in this embodiment. The piezoelectric oscillation circuit in the comparison example is initially explained, and then comparison between the circuit diagram of the piezoelectric oscillation circuit in this embodiment and the comparison example is touched upon with reference to FIG. 2.

1.2.1 Piezoelectric Oscillation Circuit of Comparison Example

FIG. 7 is a circuit diagram showing a piezoelectric oscillation circuit 110 in the comparison example. The piezoelectric oscillation circuit 110 includes a first circuit unit 120, a Colpitts oscillation circuit 130, and a piezoelectric resonator 140. These components correspond to the first circuit unit 20, the Colpitts oscillation circuit 30, and the piezoelectric resonator 40 of the piezoelectric oscillation circuit 10 in the first embodiment. However, the piezoelectric oscillation circuit 110 in the comparison example does not have the circuit corresponding to the second circuit unit 50 in the first embodiment.

The first circuit unit 120 has capacitors for controlling an oscillation frequency and other elements. More specifically, the first circuit unit 120 has capacitors 121 and 123, a variable capacitance diode 122, and a resistance 124 as illustrated in FIG. 7. According to this example, the capacitor 121 as one of the capacitors 121 and 123 provided for frequency control is a variable-capacity capacitor, while the other capacitor 123 is a fixed-capacity capacitor. However, the capacity of the capacitor 121 may be fixed, or the capacity of the capacitor 123 may be variable. The oscillation frequency is chiefly determined by the capacities of the capacitors 121 and 123, while the variable capacitance diode 122 is equipped for fine adjustment of the oscillation frequency. A control voltage $V_{CIN}$ may be supplied to the variable capacitance diode 122 via an input resistance 160. The resistance 124 is required for fixing the direct current potential at the anode terminal of the variable capacitance diode 122 for determination of the capacitance of the variable capacitance diode 122. The first circuit unit 120 is connected with a first terminal 141 of the piezoelectric resonator 140. More specifically, one of the terminals of the capacitor 121 is connected with the first terminal 141.

According to the first circuit unit 120 having this structure, the capacitor 123 can prevent clipping of an internal signal 161 provided in the form of a sine wave. More specifically, the presence of the capacitor 123 does not allow the sine wave contained in the internal signal 161 and superimposed on the potential corresponding to the control voltage $V_{CIN}$ to be clipped by a ground potential even when the control voltage $V_{CIN}$ varies. There is also a possibility that the sine wave is clipped by the variable capacitance diode 122 which provides rectification depending on the level of the control voltage $V_{CIN}$. According to this circuit structure, however, this problem can be avoided by setting the resistance value of the resistance 124 at an appropriate value.

The Colpitts oscillation circuit 130 has an oscillation transistor 136, resistances 131, 132, 133, and 137, and capacitors 134 and 135 as illustrated in FIG. 7. The Colpitts oscillation circuit 130 is connected with a second terminal 142 of the piezoelectric resonator 140. A signal transmitted from the second terminal 142 is controlled to an appropriate level by a bias voltage given from a resistance dividing circuit constituted by resistances (dividing resistances) 131 and 133, and inputted to a gate of the oscillation transistor 136. The Colpitts oscillation circuit 130 may produce an output signal based on an internal signal 163, for example.

1.2.2 Problems Arising from Piezoelectric Oscillation Circuit of Comparison Example According to the piezoelectric oscillation circuit 110 in the comparison example, the second terminal 142 is connected with a ground potential via the resistance 133, while the first terminal 141 is connected with the capacitor 121 and brought into a so-called "separated" condition. In this case, a change of the ground potential only affects the second terminal 142, and produces a direct current potential difference between the terminals of the piezoelectric resonator 140. The direct current potential difference thus produced varies the oscillation frequency, and decreases the stability of the oscillation frequency.

FIGS. 8A and 8B show an example of a temperature-constant piezoelectric oscillator. As explained in detail later, the ground potential can vary depending on the use operation environment of the temperature-constant piezoelectric oscillator. Thus, problems associated with specifications may arise when the piezoelectric oscillation circuit 110 in the comparison example is incorporated in a temperature-constant piezoelectric oscillator requiring extremely high frequency stability. These problems arising from the piezoelectric oscillation circuit 110 in the comparison example applied to a temperature-constant piezoelectric oscillator 1 are now specifically described.

FIG. 8A is a top view of the temperature-constant piezoelectric oscillator 1. The temperature-constant piezoelectric oscillator 1 includes an oscillation device 7, a thermo-sensitive device 5, and a temperature control device 3 disposed on a board 8. Circles in the figure show members for supporting the board and parts. These supporting members may not only support the parts and the like but also provide electrical connection via wires provided inside the supporting members, for example. The oscillation device 7 has the Colpitts oscillation circuit 130 and the first circuit unit 120 of the piezoelectric oscillation circuit 110. The thermo-sensitive device 5 is constituted by a thermistor, for example, which varies resistance in accordance with a detected temperature. The temperature detected by the thermo-sensitive device 5 is a temperature within a temperature-constant oven positioned sufficiently away from a heater, for example. The temperature control device 3 detects the temperature based on the conditions of the thermo-sensitive device 5 and a thermo-sensitive device 4 (described later), and controls the heater according to the detected temperature such that the temperature of the temperature-constant oven can be maintained at a target temperature. The temperature-constant piezoelectric oscillator 1 is sealed by a metal cover 9, for example, to constitute the temperature-constant oven, which cover 9 is not shown in the figure.

FIG. 8B is a side view of the temperature-constant piezoelectric oscillator 1. FIG. 8B shows the temperature-constant piezoelectric oscillator 1 as viewed from below with respect to the illustration in FIG. 8A. The parts in FIG. 8B which correspond to the same parts in FIG. 8A have been given the same reference numbers, and the same explanation of those is not repeated.

A piezoelectric resonator 2, a power transistor 6, and the other thermo-sensitive device 4 are fixed below the board 8 via the supporting members. The piezoelectric resonator 2 corresponds to the piezoelectric resonator 140 of the piezoelectric oscillation circuit 110. The power transistor 6 is provided as the heater which maintains a constant temperature inside the temperature-constant oven. The inside temperature of the temperature-constant oven can be kept constant by using the temperature control device 3 capable of controlling the drain current of the power transistor 6, for example. The thermo-sensitive device 4 may directly detect the temperature of the power transistor 6 provided as the heater. The temperature control device 3 detects the accurate temperature based on the conditions of the thermo-sensitive devices 4 and 5, and controls the drain current of the power transistor 6. A Lead (not shown) extending from the thermo-sensitive device 4 toward the temperature control device 3 may function as a member for supporting the thermo-sensitive device 4.

When the use environment temperature of the temperature-constant piezoelectric oscillator 1 drops in this example, a large drain current flows in the power transistor 6 to maintain the constant temperature within the temperature-constant oven. In an actual situation, a ground potential connected with the temperature-constant piezoelectric oscillator 1 has a small resistance, which gives a deviation of several millivolts from the ground potential when the large drain current flows. In this case, a direct current potential difference is produced between the terminals of the piezoelectric resonator 140 of the piezoelectric oscillation circuit 110 in the comparison example included in the temperature-constant piezoelectric oscillator 1 due to the change of the ground potential as explained above. As a result, the oscillation frequency varies, and does not satisfy the level of frequency stability required in the specifications of the temperature-constant piezoelectric oscillator 1 (0.05 ppm, for example) in some cases.

1.2.3 Solution to Problems by Piezoelectric Oscillation Circuit of Embodiment

Figure 2:
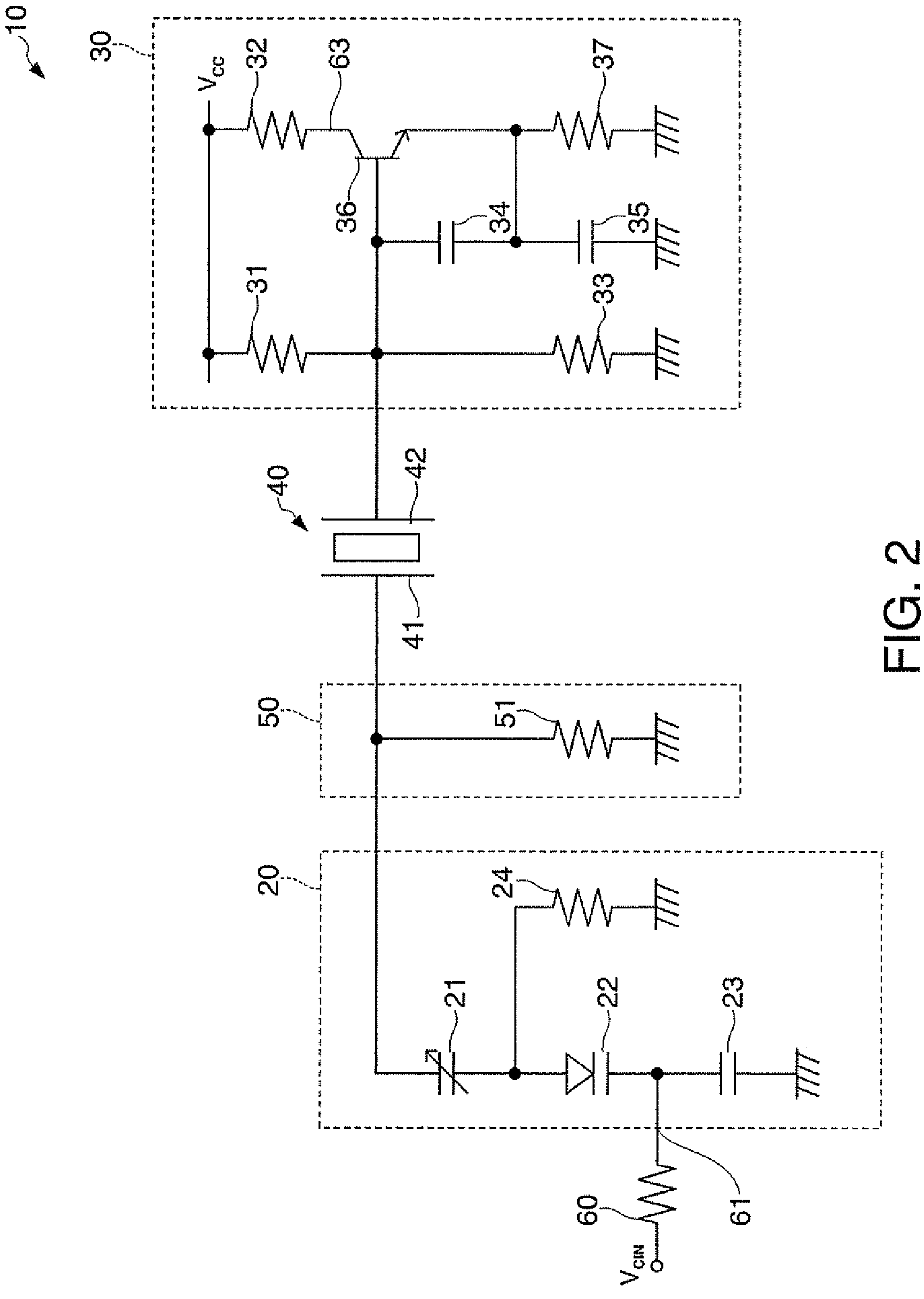
FIG. 2 is a circuit diagram of the piezoelectric oscillation circuit according to the first embodiment.

FIG. 2 is a circuit diagram showing the piezoelectric oscillation circuit 10 according to this embodiment. The parts in FIG. 2 which correspond to the same parts in FIG. 1 have been given the same reference numbers, and the same explanation of those is not repeated.

The piezoelectric oscillation circuit 10 in this embodiment is a circuit which adds the second circuit unit 50 to the piezoelectric oscillation circuit 110 in the comparison example (FIG. 7). The first circuit unit 20, the Colipitts oscillation circuit 30, and the piezoelectric resonator 40 correspond to the first circuit unit 120, the Colpitts oscillation circuit 130, and the piezoelectric resonator 140 in the comparison example, respectively, and have the same circuit structures. The explanation of these components is not repeated herein.

The second circuit unit 50 connects the first terminal 41 of the piezoelectric resonator 40 with a ground potential via a resistance 51. The second terminal 42 is connected with a ground potential via a dividing resistance 33 in a resistance dividing circuit of the Colpitts oscillation circuit 30. According to this structure, each of the terminals of the piezoelectric resonator 40 is connected with the ground potential via the resistance. In this case, a change of the ground potential has equal effects on the first terminal 41 and the second terminal 42, and does not vary the direct current potential difference between the terminals of the piezoelectric resonator 40. Therefore, the piezoelectric oscillation circuit 10 in this embodiment can more securely stabilize the oscillation frequency than the piezoelectric oscillation circuit 110 in the comparison example.

The piezoelectric oscillation circuit 10 in this embodiment is applicable to a temperature-constant piezoelectric oscillator requiring extremely high frequency stability. For example, the piezoelectric oscillation circuit 10 in this embodiment can be produced by using the oscillation device 7 and the piezoelectric resonator 2 of the temperature constant piezoelectric oscillator 1 shown in FIGS. 8A and 8B. In this case, the temperature-constant piezoelectric oscillator 1 including the piezoelectric oscillation circuit 10 provides higher frequency stability than the temperature-constant piezoelectric oscillator including the piezoelectric oscillation circuit 110 in the comparison example even at a low environment temperature.

The resistance value of the dividing resistance 33 included in the resistance dividing circuit of the piezoelectric oscillation circuit 10 is set within the range from several kΩ to several ten kΩ, for example. However, the resistance value of the resistance 51 of the second circuit unit 50 may be set within the range from several hundred kΩ to several MΩ. Thus, the power consumption: of the piezoelectric oscillation circuit 10 does not increase even when the second circuit unit 50 is provided. It should also be noted that the circuit scale of the piezoelectric oscillation circuit 10 which adds only one resistance to the piezoelectric oscillation circuit 110 in the comparison example does not largely increase from the circuit scale of the piezoelectric oscillation circuit 110.

Accordingly, the piezoelectric oscillation circuit 10 and the temperature-constant piezoelectric oscillator 1 including the piezoelectric oscillation circuit 10 in the first embodiment can stabilize the oscillation frequency by reducing variations in the potential between the terminals of the piezoelectric oscillator 40 even when the ground potential changes.

2. Second Embodiment

A second embodiment according to the invention is hereinafter described with reference to FIG. 3. The parts in FIG. 3 which correspond to the same parts in FIGS. 1, 2, and 7 have been given the same reference numbers, and the same explanation of those is not repeated. A piezoelectric oscillation circuit in this embodiment is applicable to the temperature-constant piezoelectric oscillator shown in FIGS. 8A and 8B as a preferable example as well.

Figure 3:
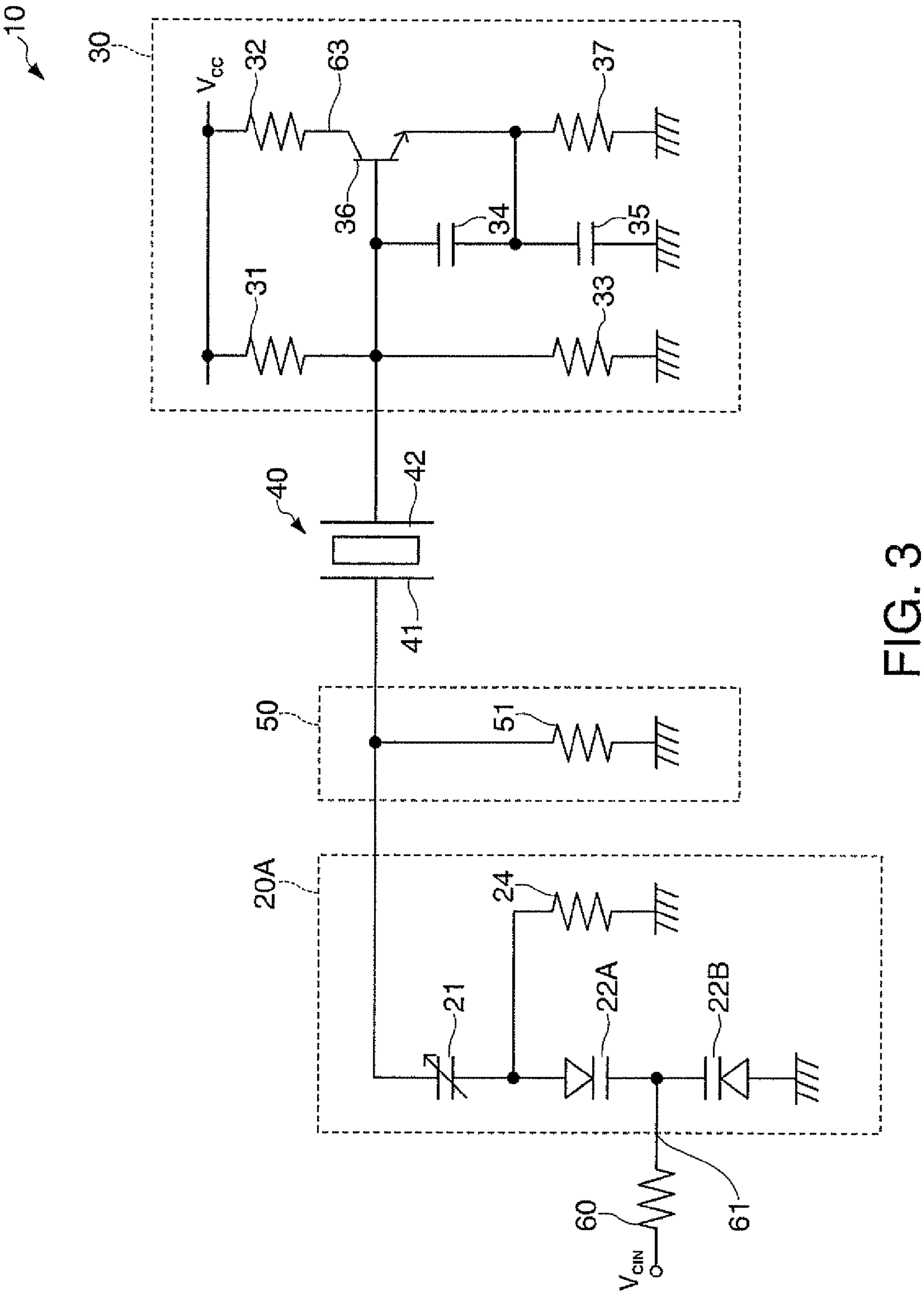
FIG. 3 is a circuit diagram of a piezoelectric oscillation circuit according to a second embodiment.

FIG. 3 is a circuit diagram showing the piezoelectric oscillation circuit 10 in the second embodiment. The piezoelectric oscillation circuit 10 in this embodiment has a circuit unit 20A different from the corresponding unit in the first embodiment. The first circuit unit 20A in this embodiment different from the corresponding unit in the first embodiment has a first variable capacitance diode 22A and a second variable capacitance diode 22B whose cathode terminals are connected with each other. The anode terminal of the first variable capacitance diode 22A is connected with a first terminal via a variable-capacity capacitor 21, and the anode terminal of the second variable capacitance diode 225 is connected with the ground potential. The control voltage $V_{CIN}$ is applied to each cathode terminal of the first variable capacitance diode 22A and the second variable capacitance diode 22B via an input resistance 60. A resistance 24 for determining the capacitance of the variable capacitance diode is required only for the first variable capacitance diode 22A.

According to the piezoelectric oscillation circuit 10 in this embodiment, the frequency variable range for varying the oscillation frequency by the control voltage $V_{CIN}$ can be expanded by using a combination of the two variable capacitance diodes 22A and 22B. Thus, a desired oscillation frequency can be easily obtained.

3. Third Embodiment

A third embodiment according to the invention is now described with reference to FIG. 4. The parts in FIG. 4 which correspond to the same parts in FIGS. 1 through 3, and 7 have been given the same reference numbers, and the same explanation of those is not repeated. A piezoelectric oscillation circuit in this embodiment is applicable to the temperature-constant piezoelectric oscillator shown in FIGS. 5A and 5B as a preferable example as well.

Figure 4:
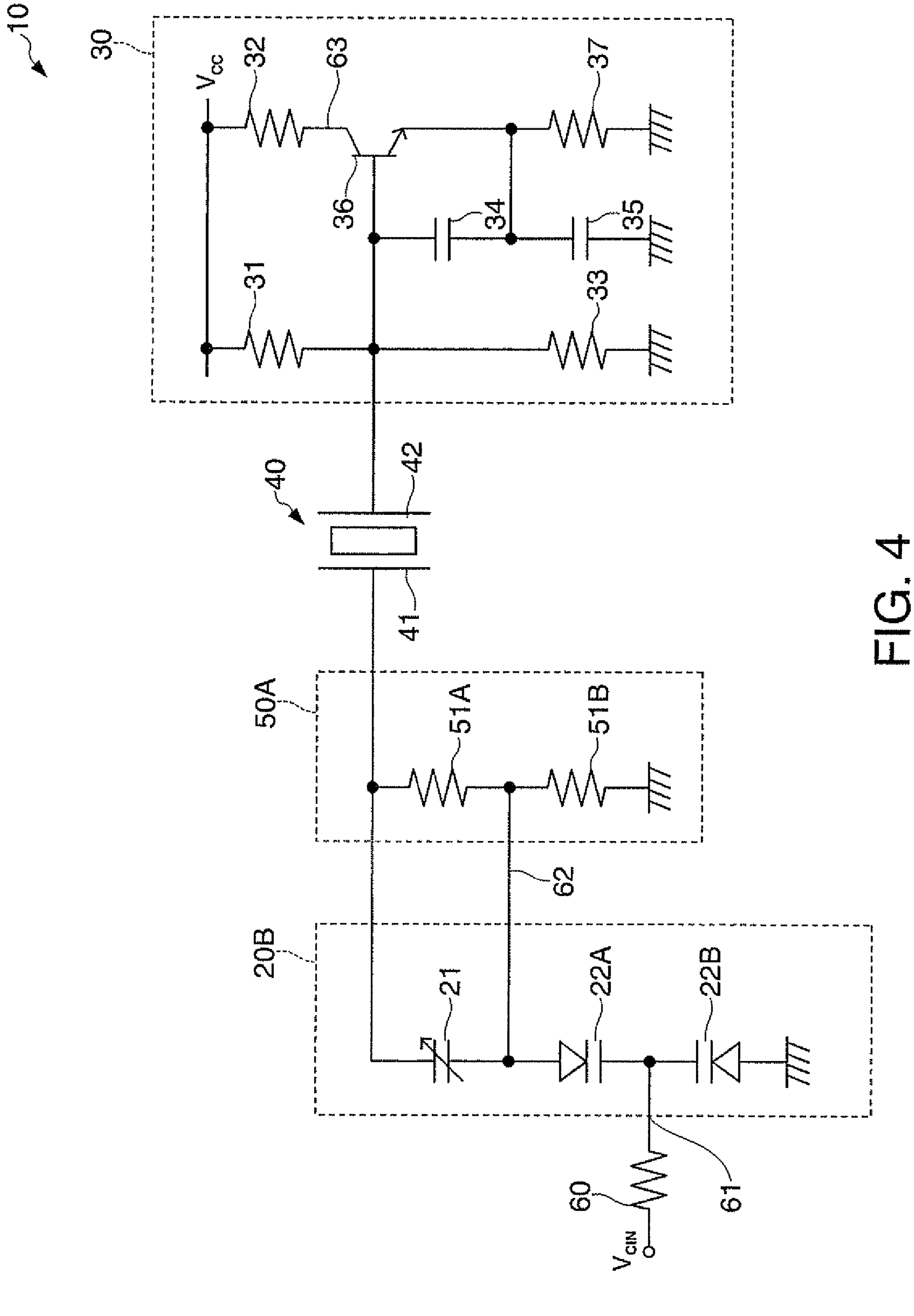
FIG. 4 is a circuit diagram of a piezoelectric oscillation circuit according to a third embodiment.

FIG. 4 is a circuit diagram of the piezoelectric oscillation circuit 10 in the third embodiment. The piezoelectric oscillation circuit 10 in this embodiment has a first circuit unit 20B and a second circuit unit 50A different from the corresponding units in the second embodiment. The first circuit unit 20B in this embodiment different from the corresponding unit in the second embodiment does not have the resistance for determining the capacitance of the first variable capacitance diode 22A. The anode of the first variable capacitance diode 22A is connected with the second circuit unit 50A by an internal signal 62, and is further connected with a ground potential via a resistance 51B of the second circuit unit 50A. The second circuit unit 50A in this embodiment connects the first terminal 41 with the ground potential via a resistance 51A and the resistance 51B connected in series.

According to this embodiment, the resistance connected with the anode terminal of the first variable capacitance diode 22A is not equipped in the first circuit unit 20B but is provided by the resistance 51B contained in the second circuit unit 50A. For example, in a structure of the piezoelectric oscillation circuit 10 provided with an array of spare devices for controlling resistance values and capacities beforehand, the second circuit unit 50A for stabilizing the oscillation frequency can be produced by using a part of the resistances disposed in an array or replacing a part of the capacitors with resistances for utilization of the existing layout, so that the second circuit unit 50A can be added to the structure without increasing the circuit scale. Moreover, the circuit scale can be decreased by using a part of the elements of the second circuit unit 50A as the resistance connected with the anode terminal of the first variable capacitance diode 22A.

According to this embodiment, the frequency variable range for varying the oscillation frequency by the control voltage $V_{CIN}$ can be expanded by using a combination of the two variable capacitance diodes 22A and 22B similarly to the second embodiment. Furthermore, stabilization of the oscillation frequency can be achieved while avoiding enlargement of the circuit scale.

4. Fourth Embodiment

A fourth embodiment according to the invention is now described with reference to FIG. 5. The parts in FIG. 5 which correspond to the same parts in FIGS. 1 through 4, and 7 have been given the same reference numbers, and the same explanation of those is not repeated. A piezoelectric oscillation circuit in this embodiment is applicable to the temperature-constant piezoelectric oscillator shown in FIGS. 8A and 8B as a preferable example as well.

Figure 5:
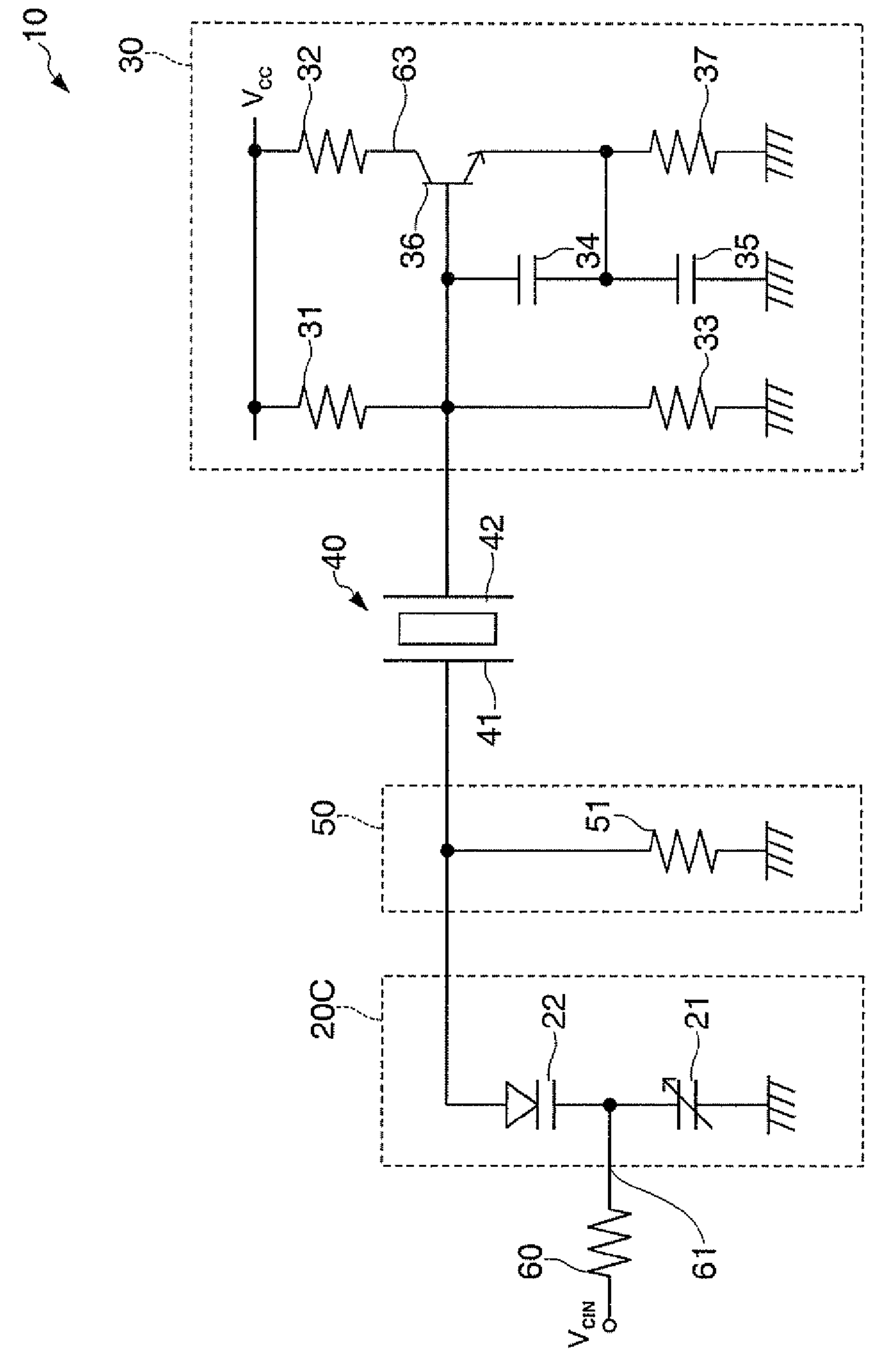
FIG. 5 is a circuit diagram of a piezoelectric oscillation circuit according to a fourth embodiment.

FIG. 5 is a circuit diagram of the piezoelectric oscillation circuit 10 in the fourth embodiment. The piezoelectric oscillation circuit 10 in this embodiment is different from the piezoelectric oscillation circuit 10 in the first embodiment only in the structure of the first circuit unit (first circuit unit 20C in this embodiment), and reduces the circuit scale by simplifying the structure of the first circuit unit 20C. The structure of the first circuit unit 20C in this embodiment is herein explained by comparison with the first embodiment (see FIG. 2).

The first circuit unit 20C in this embodiment does not have the capacitor 23 included in the first embodiment, and shifts the variable-capacity capacitor 21 to the position of the capacitor 23 in the first embodiment. The resistance 51 of the second circuit unit 50 has the function of determining the capacitance of the variable capacitance diode 22 as well. The first circuit unit 20C in this embodiment eliminates the capacitor 23 and the resistor 24 included in the first circuit unit 20 in the first embodiment, and thus has a smaller circuit scale than that of the first embodiment.

The piezoelectric oscillation circuit 10 in this embodiment stabilizes the oscillation frequency by reducing variations in the potential between the terminals of the piezoelectric resonator 40 produced by the change of the fixed potential while decreasing the circuit scale. It should be noted, however, that the change of the control voltage $V_{CIN}$ also affects the capacitor 21 determining the oscillation frequency.

5. Fifth Embodiment

A fifth embodiment according to the invention is now described with reference to FIG. 6. The parts in FIG. 6 which correspond to the same parts in FIGS. 1 through 5, and 7 have been given the same reference numbers, and the same explanation of those is not repeated. A piezoelectric oscillation circuit in this embodiment is applicable to the temperature-constant piezoelectric oscillator shown in FIGS. 8A and 8B as a preferable example as well.

Figure 6:
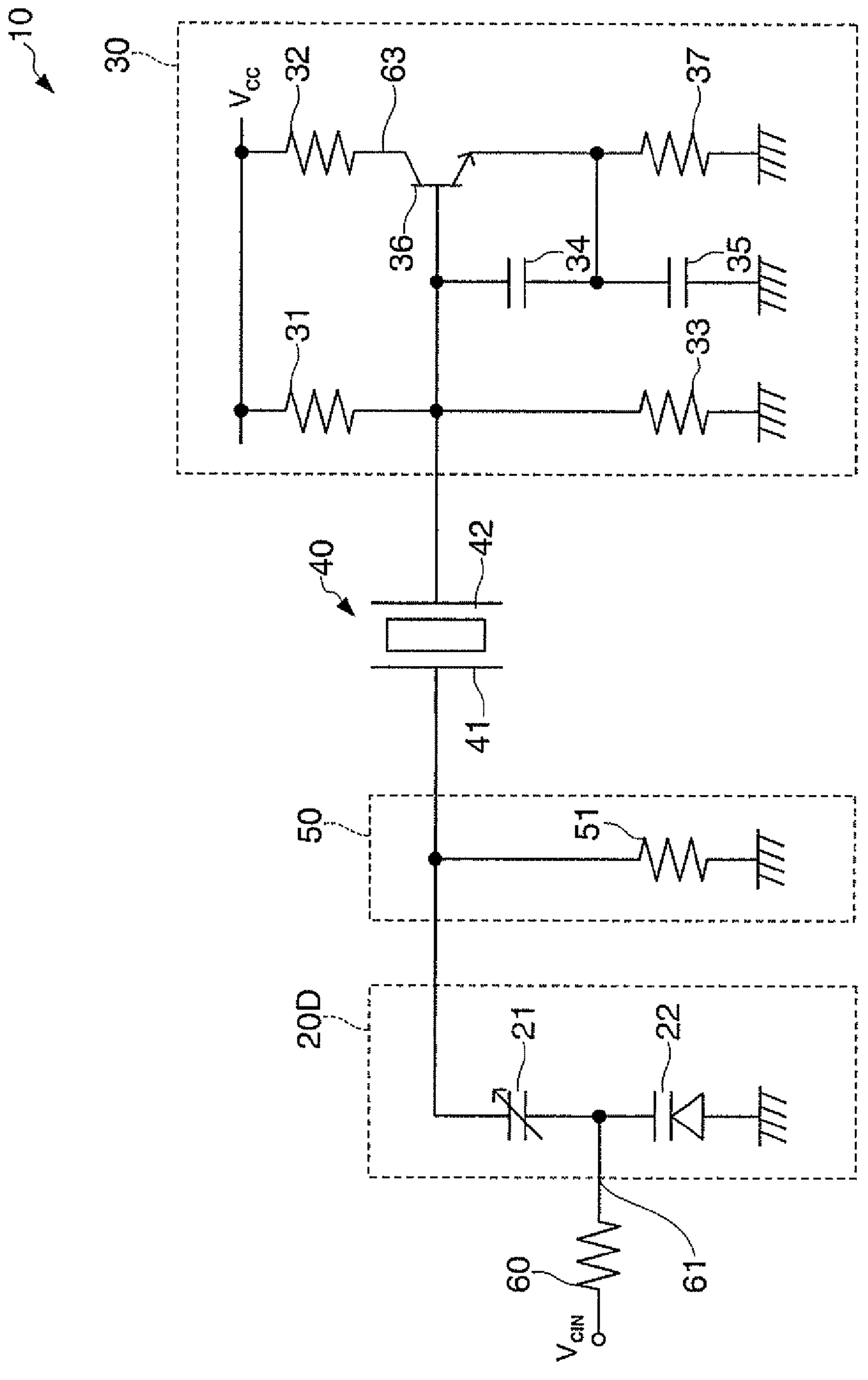
FIG. 6 is a circuit diagram of a piezoelectric oscillation circuit according to a fifth embodiment.

FIG. 6 is a circuit diagram of the piezoelectric oscillation circuit 10 in the fifth embodiment. The piezoelectric oscillation circuit 10 in this embodiment is different from the piezoelectric oscillation circuit 10 in the fourth embodiment only in the structure of the first circuit unit (first circuit unit 20D in this embodiment), and switches the positions of the variable capacitance diode 22 and the capacitor 21.

Similarly to the fourth embodiment, the piezoelectric oscillation circuit 10 in this embodiment stabilizes the oscillation frequency by reducing variations in the potential between the terminals of the piezoelectric resonator 40 produced by the change of the fixed potential while decreasing the circuit scale. It should be noted, however, that the sine wave may be clipped by the rectification of the variable capacitance diode 22 depending on the level of the control voltage $V_{CIN}$.

The invention is not limited to the embodiments described herein but includes structures substantially same as those shown in the respective embodiments (for example, structures having the same functions, produced by the same methods, and yielding the same results, or structures provided for the same objects and offering the same advantages). The invention also includes structures having different parts in place of the parts included in the structures described in the respective embodiments as not essential parts. The invention further includes structures capable of offering advantages or achieving objects same as those offered or achieved by the structures described in the respective embodiments. The invention still further includes structures as a combination of related arts and the structures described in the respective embodiments.

The entire disclosure of Japanese Patent Application No. 2010-241836, filed Oct. 28, 2010 is expressly incorporated by reference herein.

What is claimed is:

1. A piezoelectric oscillation circuit comprising:

a Colpitts oscillation circuit;

a first circuit unit which includes a circuit having a variable-capacity capacitor for controlling an oscillation frequency;

a second circuit unit which includes a circuit having a resistance; and a piezoelectric resonator which includes a first terminal connected to the first circuit unit and the second circuit unit, and a second terminal connected to the Colpitts oscillation circuit, wherein the Colpitts oscillation circuit connects the second terminal to a fixed potential via a dividing resistance, the second circuit unit connects the first terminal to the fixed potential via the resistance, the resistance being greater than the dividing resistance of the Colpitts oscillation circuit, the first circuit unit includes a variable capacitance diode used as a variable-capacity element, and inputs a control voltage for determining the capacitance of the variable capacitance diode, the first circuit unit directly connects the anode terminal of the variable capacitance diode to the first terminal via the variable-capacity capacitor and to the fixed potential via a resistance different from the resistance of the second circuit unit, and the first circuit having a second variable capacitance diode, an anode terminal of the second variable capacitance diode being directly connected with a fixed potential.

2. The piezoelectric oscillation circuit according to claim 1, wherein the fixed potential is a ground potential.

3. A temperature-constant piezoelectric oscillator, comprising the piezoelectric oscillation circuit according to claim 1.

4. A temperature-constant piezoelectric oscillator, comprising the piezoelectric oscillation circuit according to claim 2.

5. A piezoelectric oscillation circuit comprising:

a Colpitts oscillation circuit;

a first circuit unit which includes a circuit having a variable-capacity capacitor for controlling an oscillation frequency;

a second circuit unit which includes a circuit having a resistance; and a piezoelectric resonator which includes a first terminal connected to the first circuit unit and the second circuit unit, and a second terminal connected to the Colpitts oscillation circuit, wherein:

the Colpitts oscillation circuit connects the second terminal to a fixed potential via a dividing resistance, the second circuit unit connects the first terminal to the fixed potential via the resistance, the resistance being greater than the dividing resistance of the Colpitts oscillation circuit, the first circuit unit includes a variable capacitance diode used as a variable-capacity element, and inputs a control voltage for determining the capacitance of the variable capacitance diode, and the first circuit unit includes a fixed-capacity capacitor, directly connects the anode terminal of the variable capacitance diode to the first terminal via the variable-capacity capacitor and to the fixed potential via a resistance different from the resistance of the second circuit unit, and directly connects the cathode terminal of the variable capacitance diode to which the control voltage is applied to the fixed potential via the fixed-capacity capacitor.

6. The piezoelectric oscillation circuit according to claim 5, wherein the fixed potential is a ground potential.

7. A temperature-constant piezoelectric oscillator, comprising the piezoelectric oscillation circuit according to claim 5.

8. A temperature-constant piezoelectric oscillator, comprising the piezoelectric oscillation circuit according to claim 6.

* * * * *